United States Patent
Dortu

(10) Patent No.: US 7,499,371 B2
(45) Date of Patent: Mar. 3, 2009

(54) SEMICONDUCTOR MEMORY SYSTEM WITH A VARIABLE AND SETTABLE PREAMBLE F

(75) Inventor: Jean-Marc Dortu, Tokyo (JP)

(73) Assignee: Infineon Technologies AG, Munich (DE)

(*) Notice: Subject to any disclaimer, the term of this patent is extended or adjusted under 35 U.S.C. 154(b) by 191 days.

(21) Appl. No.: 11/288,941

(22) Filed: Nov. 28, 2005

(65) Prior Publication Data

US 2006/0140025 A1 Jun. 29, 2006

(30) Foreign Application Priority Data

Nov. 26, 2004 (DE) ................ 10 2004 057 232

(51) Int. Cl.
*G11C 8/18* (2006.01)
(52) U.S. Cl. ................... 365/233.12; 365/233.13; 365/233.19; 365/193; 365/194
(58) Field of Classification Search .......... 365/233, 365/193, 194, 191, 233.13, 233.14, 233.19, 365/233.12
See application file for complete search history.

(56) References Cited

U.S. PATENT DOCUMENTS 5,448,528 A 9/1995 Nagai
5,467,311 A * 11/1995 Wiedmann et al. ...... 365/189.05
5,703,830 A * 12/1997 Yasuhiro ................ 365/233.18
6,154,418 A * 11/2000 Li .............................. 365/233
6,215,710 B1* 4/2001 Han et al. .................... 365/193
6,633,965 B2 10/2003 Rentschler et al.
6,819,599 B2* 11/2004 Schaefer ................ 365/189.07
6,990,562 B2 1/2006 Rentschler et al.
7,103,793 B2 9/2006 Rentschler et al.
7,286,440 B2* 10/2007 Yoo ........................... 365/233
7,349,269 B2* 3/2008 Schaefer ..................... 365/193

FOREIGN PATENT DOCUMENTS

DE 102 12 642 10/2002
DE 10 2004 057232 A1 * 6/2006

* cited by examiner

*Primary Examiner*—Andrew Q Tran
(74) *Attorney, Agent, or Firm*—Patterson & Sheridan, L.L.P.

(57) ABSTRACT

The present invention relates to a method for operating a semiconductor memory apparatus, comprising: transmitting a command instruction, particularly a write instruction and/or a read instruction, to the semiconductor memory apparatus; transmitting a data signal to and/or from the semiconductor memory apparatus; and transmitting a data clock signal is transmitted for the purpose of latching the data signal; wherein the preamble (P), which is the number of clock cycles between the first edge of the data clock signal (WQDS) and the first bit (D0) of the data signal (DQ), can be set. The invention also relates to a semiconductor memory system comprising a semiconductor memory apparatus and a processor unit configured to perform the method.

11 Claims, 1 Drawing Sheet

SEMICONDUCTOR MEMORY SYSTEM WITH A VARIABLE AND SETTABLE PREAMBLE F

CROSS-REFERENCE TO RELATED APPLICATIONS

This application claims foreign priority benefits under 35 U.S.C. §119 to co-pending German patent application number DE 10 2004 057 232.1, filed 26 Nov. 2004. This related patent application is herein incorporated by reference in its entirety.

BACKGROUND OF THE INVENTION

1. Field of the Invention

The invention relates to a method for operating a semiconductor memory apparatus and to a semiconductor memory system.

2. Description of the Related Art

For the operation of semiconductor memory apparatuses, a predetermined latency is provided between the application of a write or read instruction and the actual transmission of the data bits. The latency indicates how many clock cycles after the application of the write or read instruction the actual transmission of the data bits takes place. The latency indicates the period of time (i.e. the number of clock cycles) between application of the command (write or read) and the transmission of the first data bit. In addition, a predetermined preamble is provided, which indicates how many clock cycles elapse between the first edge of a data clock signal and the first transmitted bit of the data signal.

SUMMARY OF THE INVENTION

It is thus an object of the present invention to provide a method for operating a semiconductor memory apparatus and a semiconductor memory system which easily ensures reliable operation of the semiconductor memory apparatus for various frequencies without impairing the power of the semiconductor memory apparatus at the same time. The invention provides a method for operating a semiconductor memory apparatus. The method comprises transmitting a command instruction, such as a write or read instruction, to the semiconductor memory apparatus, transmitting a data signal to and/or from the semiconductor memory apparatus, wherein data bits are written and read to and from the semiconductor memory apparatus, and transmitting a data clock signal for the purpose of latching the data signal or for the purpose of transmitting or outputting the data signal upon a rising or falling edge of the data clock signal, wherein the preamble, which is the number of clock cycles between the first edge of the data clock signal and the first latched bit of the data signal, can be set.

The ability to set the preamble provides a simple way of operating the semiconductor memory apparatus in a plurality of frequency ranges without losses in power.

For one particular operating frequency, the edge positioning accuracy increases as the number of preamble cycles increases. This can be explained by the fact that a standing wave is formed on the data clock line. The highest accuracy would be achieved if the number of preamble cycles were approaching infinity. In this case, the data clock signal would be similar to a clock or clock signal. This is not possible in application, however. Hence, a predetermined maximum number of clock cycles is provided as a preamble, for which an acceptable edge positioning accuracy can be achieved.

Since the period duration becomes ever smaller as frequency rises, the edge positioning accuracy of the data clock signal is more critical the higher the operating frequency. A demanded level of accuracy is achieved by virtue of a larger number of preamble cycles being provided.

Preferably, the preamble can be set using a configuration instruction, and the method comprises a step of setting the preamble. The configuration instruction is preferably a mode register set instruction (MRS instruction). The configuration instruction or the configuration instruction sequence is transmitted to the semiconductor memory apparatus preferably at least at the start of operation. In addition, one or a plurality of configuration instruction sequence(s) can be transmitted during operation. Preferably, the configuration instruction contains at least one predeterminable bit for setting the preamble. Through suitable use of the bit(s) for setting the preamble, it is possible to stipulate the length of the preamble in a simple manner.

A further preference is for the configuration instruction to be in a form such that the preamble is equal to the latency, the latency being the number of clock cycles between the command instruction and the first edge of the data signal.

It is thus also possible to provide for the setting of the preamble to be coupled to the setting of the latency.

The invention also provides a semiconductor memory system. The semiconductor memory system comprises a semiconductor memory apparatus; a processor unit which is designed, to transmit a command, such as write instruction and/or a read instruction, to the semiconductor memory apparatus, to transmit a data signal to and/or from the semiconductor memory apparatus to write and read data bits to and from the semiconductor memory apparatus, and to transmit a data clock signal to the semiconductor memory apparatus for the purpose of latching the data signal, wherein the semiconductor memory system is configurable so that the preamble, which is the number of clock cycles between the first edge of the data clock signal and the first bit of the data signal, can be set.

Preferably, the preamble can be set using a configuration instruction. The configuration instruction can contain at least one predeterminable bit for setting the preamble. Preferably, the configuration instruction can set the preamble equal to the latency, the latency being the number of clock cycles between the command instruction and the first edge of the data signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

A preferred embodiment of the present invention is described below with reference to FIG. 1 and FIG. 2. FIG. 2 illustrates a block diagram of a semiconductor memory system 20 comprising a semiconductor memory apparatus 21 and a processor unit 22. The processor unit is configured to (i) transmit a command instruction to the semiconductor memory apparatus, wherein the command instruction is at least one of a write instruction and a read instruction, (ii) communicate a data signal with the semiconductor memory apparatus, (iii) transmit a data clock signal to latch the data signal, and (iv) set a preamble which represents a number of clock cycles between a first edge of the data clock signal and a first bit of the data signal.

Figure 1:
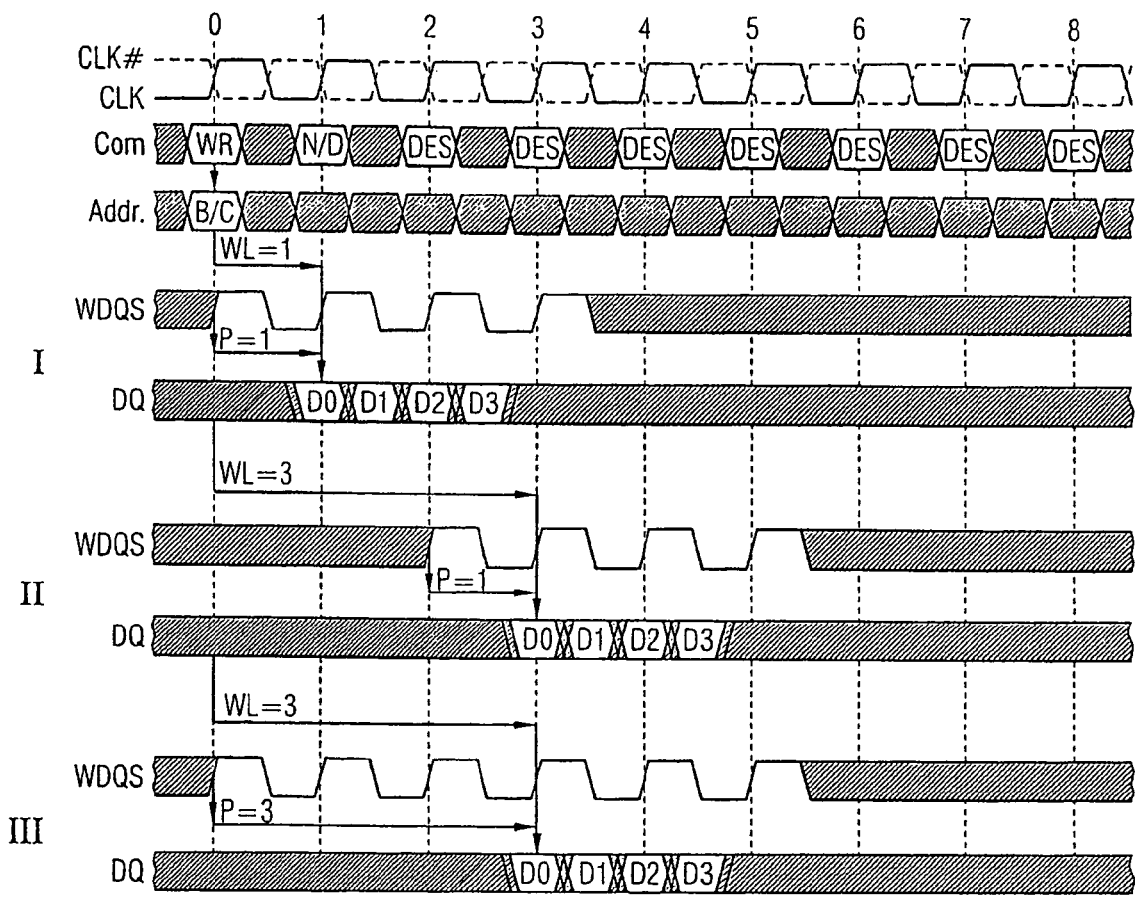
FIG. 1 shows a signal flow diagram for the writing of data to the semiconductor memory apparatus for various values of the preamble and latency.
Figure 2:
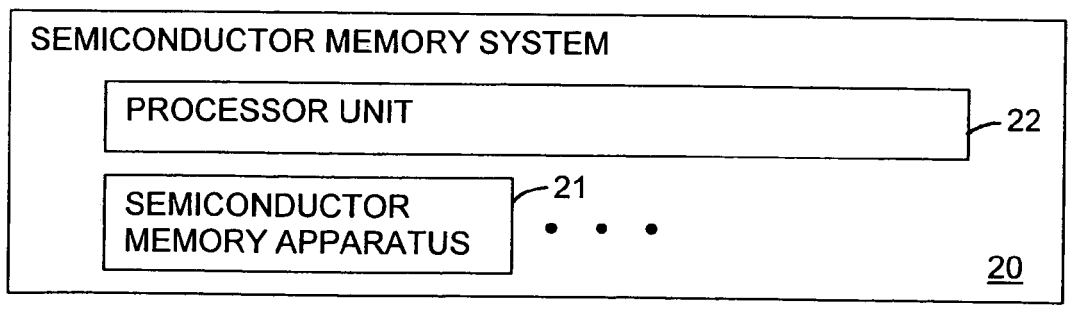
FIG. 2 is a block diagram of a semiconductor memory system.

FIG. 1 shows a signal flow diagram for signals during the writing of data to a semiconductor memory apparatus. FIG. 1 shows three signal profiles, I, II and III, which represent the signal profile of a write data clock signal WDQS and of the associated data signal DQ for different values of a latency or write latency WL and of a preamble P. In the signal diagram shown in FIG. 1, the signal CLK denotes the general clock signal which is used to operate the semiconductor memory apparatus. In this context, CLK# is the inverse clock signal thereof. The signal profile Corn indicates the signal profile of instructions to the semiconductor memory apparatus. The signal profile Addr indicates the signal profile of an addressing signal.

In line with one preferred embodiment of the present invention, a method for operating a semiconductor memory apparatus is provided in which the preamble is in settable form, as described in detail below. By having the preamble in settable form, the preamble can be matched to the respective operating frequency of the semiconductor memory apparatus. In particular, the preamble is chosen to be smaller for low operating frequencies than for high operating frequencies.

When operating a semiconductor memory apparatus and particularly when transmitting a read or write instruction to a semiconductor memory apparatus, a latency may be required. The latency is the period of time between application of the command (write or read) and the transmission of the first data bit. The latency is obtained particularly through the signal propagation times in the semiconductor memory apparatus. The latency is preferably indicated as a multiple of one clock period.

In addition, a preamble is provided for the operation of the semiconductor memory apparatus, said preamble being the period of time between the first edge of the data clock signal and the first transmitted data bit. The preamble is preferably indicated as the number of clock cycles which elapse before the first data bit is transmitted. The data clock signal is a signal which is respectively produced essentially only for the period of time in which data are intended to be read or written from or to the semiconductor memory apparatus. The data clock signal is generated particularly from the general clock signal and is an essentially noncontinuous clock signal, i.e. the data clock signal is a clock signal which is present only within predeterminable periods of time.

When the data clock signal is applied to the data clock signal line, a standing wave is first produced on the data clock signal line. The standing wave means that the edge positioning accuracy of the edges of the data clock signal is low at first. As a result of the standing wave, the setup time and the hold time which is required for transmitting the data signals cannot be observed, which results in incorrect data transmission. In this context, the setup time is that period of time before an edge of a data clock signal in which a data signal which is intended to be read in upon the edge needs to have a predetermined value. The hold time in this context is that period of time after an edge of a data clock signal in which a data signal which is intended to be read in upon the edge needs to have a predetermined value. The more time has elapsed after the application of the data clock signal, the higher is the edge positioning accuracy.

For one particular operating frequency, the edge positioning accuracy increases as the number of preamble cycles increases. The highest accuracy would be achieved if the number of preamble cycles were to approach infinity. In this case, the data clock signal would be similar to a clock or to a clock signal. This is not possible in application, however. A predetermined maximum number of clock cycles is therefore provided as a preamble, for which a required edge positioning accuracy can be achieved. Since the period duration becomes ever shorter as frequency increases, the edge positioning accuracy of the data clock signal is more critical the higher the operating frequency. A required level of accuracy is achieved by virtue of a larger number of preamble cycles being provided. In contrast, a smaller number of clock cycles is required for a lower operating frequency, since the clock cycles have a longer period duration.

The data clock signal can be produced until a write or read command is applied to the semiconductor memory apparatus. Since the preamble is directly associated with the first edge of the data clock signal, the value of the latency cannot be smaller than a value for the preamble.

As set out above, it is necessary for the latency to be greater than or equal to the preamble for operation of the semiconductor memory apparatus. The latency can thus also be reduced accordingly by varying the preamble, and particularly reducing the preamble for low operating frequencies.

Provision can be made for the preamble to be able to be set using a configuration instruction. The configuration instruction is preferably a mode register set instruction (MRS instruction).

The configuration instruction or the configuration instruction sequence is transmitted to the semiconductor memory apparatus preferably at least at the start of operation. In addition, one or a plurality of configuration instruction sequence(s) can be transmitted during operation. In particular, the configuration instruction may contain one or more bits for setting the preamble.

It is also possible to provide the setting for the preamble together with the definition for the latency in the configuration or the mode register of the semiconductor memory apparatus. In particular, the definition of the length of the preamble can be combined with or coupled to the definition of the length of the latency in this context. In such a case, it is advantageous for the preamble and the latency to have the same value.

The text below describes three examples for different values of the latency and the preamble with reference to FIG. 1. FIG. 1 shows the signal profile for writing data to the semiconductor memory apparatus. A corresponding signal profile is likewise obtained for reading data from the semiconductor memory apparatus. In this context, it should be remembered that while data are being read, the data clock signal is edge-aligned relative to the data signal. This means, in particular, that the edge of the data signal arrives at the same time as the edge of the data clock signal. In contrast to this, the data clock signal and the data signal are "center-aligned" when data are being written, which means that essentially the time average of a data bit in the data signal arrives at the same time as an edge of a data clock signal.

First, the example labeled I will be described in detail. It should be remembered that the signal profile of the CLK signal, the Com signal and the Addr signal is the same for all three examples.

In the illustrated example, a write latency WL of 1 and a preamble P likewise with the value 1 are assumed.

At time 0, a write instruction WR is transmitted to the semiconductor memory apparatus. The data clock signal WDQS is activated. In the present case, the first edge of the data clock signal WDQS coincides essentially with the transmission of the write instruction WR at time 0. Since the write latency WL and the preamble P each have the value 1, the first data bit D0 is transmitted at time 1, i.e., one clock period later. The data clock signal WDQS continues until all the data bits D1 to D3 have been latched or transmitted.

In the example labeled II, a write latency WL of 3 and a preamble of 1 are assumed. In this case, the data clock signal WDQS does not start until time 2, i.e., two clock periods after the write command WR is transmitted. At a subsequent time 3, i.e. three clock periods after the write signal WR is transmitted (which corresponds to the latency) and one clock period after the first edge of the data clock signal WDQS (which corresponds to the preamble), the data bits D0 to D3 are transmitted.

In the example labeled III, a write latency WL of 3 and a preamble of likewise 3 are assumed. This example is similar to the example labeled I, with the data bits not being transmitted until after three clock periods, i.e. at a time 3.

While the foregoing is directed to embodiments of the present invention, other and further embodiments of the invention may be devised without departing from the basic scope thereof, and the scope thereof is determined by the claims that follow.

What is claimed is:

1. A method for operating a semiconductor memory apparatus, comprising:
   transmitting a command instruction to the semiconductor memory apparatus, wherein the command instruction is at least one of a write instruction and a read instruction;
   communicating a data signal with the semiconductor memory apparatus;
   transmitting a data clock signal to latch the data signal; and
   setting a preamble, wherein the preamble is a period of time between a first edge of the data clock signal and a first bit of the data signal, and wherein the data clock signal is present only during a read or write operation initiated by the command instruction and during which data is read or written from or to the semiconductor memory apparatus, wherein setting the preamble comprises setting a number of clock cycles of the data clock signal in the period of time defined by the preamble.

2. The method of claim 1, wherein the preamble is set utilizing a configuration instruction.

3. The method of claim 2, wherein the configuration instruction contains at least one bit for setting the preamble.

4. The method of claim 3, wherein the preamble is set to equal to a latency which represents the number of clock cycles between the command instruction and the first edge of the data signal.

5. The method of claim 3, wherein the preamble is set to be greater than a latency which represents the number of clock cycles between the command instruction and the first edge of the data signal.

6. A system, comprising:
   a semiconductor memory apparatus;
   a processor unit which is configured to:
      transmit a command instruction to the semiconductor memory apparatus, wherein the command instruction is at least one of a write instruction and a read instruction;
      communicate a data signal with the semiconductor memory apparatus;
      transmit a data clock signal to latch the data signal; and
      set a preamble, wherein the preamble is a period of time between a first edge of the data clock signal and a first bit of the data signal, and wherein the data clock signal is present only during a read or write operation initiated by the command instruction and during which data is read or written from or to the semiconductor memory apparatus, wherein the preamble is set by setting a number of clock cycles of the data clock signal in the period of time defined by the preamble.

7. The system of claim 6, wherein the preamble is set utilizing a configuration instruction.

8. The system of claim 7, wherein the configuration instruction contains at least one bit for setting the preamble.

9. The system of claim 8, wherein the preamble is set to equal to a latency which represents the number of clock cycles between the command instruction and the first edge of the data signal.

10. The system of claim 8, wherein the preamble is set to be greater than a latency which represents the number of clock cycles between the command instruction and the first edge of the data signal.

11. A method for operating a semiconductor memory apparatus, comprising:
    transmitting a command instruction to the semiconductor memory apparatus, wherein the command instruction is at least one of a write instruction and a read instruction;
    communicating a data signal with the semiconductor memory apparatus;
    transmitting a data clock signal to latch the data signal; and
    transmitting a configuration instruction to the semiconductor memory apparatus, wherein the configuration instruction sets a mode register value selected from at least two predefined values; wherein each of the predefined values sets a preamble length, wherein the preamble length is a period of time between a first edge of the data clock signal and a first bit of the data signal, and wherein the data clock signal is present only during a read or write operation initiated by the command instruction and during which data is read or written from or to the semiconductor memory apparatus, wherein each of the predefined values sets the preamble length by setting a number of clock cycles of the data clock signal in the period of time defined by the preamble length.

* * * * *